(12) United States Patent
Jin et al.

(10) Patent No.: US 8,872,306 B2
(45) Date of Patent: Oct. 28, 2014

(54) ELECTRICAL INTERCONNECTION STRUCTURES INCLUDING STRESS BUFFER LAYERS

(71) Applicant: Samsung Electronics Co., Ltd., Suwon-si (KR)

(72) Inventors: Jeonggi Jin, Osan-si (KR); Jeong-woo Park, Suwon-si (KR); Ju-il Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/797,655

(22) Filed: Mar. 12, 2013

(65) Prior Publication Data

US 2013/0334656 A1 Dec. 19, 2013

(30) Foreign Application Priority Data

Jun. 13, 2012 (KR) .................. 10-2012-0063075

(51) Int. Cl.
*H01L 23/525* (2006.01)
*H01L 23/48* (2006.01)
*H01L 23/00* (2006.01)
*H01L 23/31* (2006.01)
*H01L 25/065* (2006.01)
*H01L 23/29* (2006.01)

(52) U.S. Cl.
CPC ... *H01L 23/5256* (2013.01); *H01L 2224/13005* (2013.01); *H01L 2224/13116* (2013.01); *H01L 2224/13147* (2013.01); *H01L 23/481* (2013.01); *H01L 2224/05571* (2013.01); *H01L 2224/13113* (2013.01); *H01L 23/293* (2013.01); *H01L 2224/16146* (2013.01); *H01L 24/13* (2013.01); *H01L 2224/13082* (2013.01); *H01L 24/05* (2013.01); *H01L 2224/13124* (2013.01);

(Continued)

(58) Field of Classification Search
None
See application file for complete search history.

(56) References Cited

U.S. PATENT DOCUMENTS 6,639,315 B2 10/2003 Kazama et al.
6,730,982 B2 * 5/2004 Barth et al. .................. 257/529

(Continued)

FOREIGN PATENT DOCUMENTS

JP  2002-280484       9/2002
KR  1020010068593 A   7/2001
KR  1020010105769 A   11/2001

OTHER PUBLICATIONS

ASE Design Guidelines, Mar. 2007, "Advanced Semiconductor Engineering, Inc. WLCSP Design Guide", p. 11, 5.2.3, Table 5.*

*Primary Examiner* — Peniel M Gumedzoe
*Assistant Examiner* — Quy Tran
(74) *Attorney, Agent, or Firm* — Myers Bigel Sibley & Sajovec, PA

(57) ABSTRACT

Provided are electrical connection structures and methods of fabricating the same. The structures may include a substrate including a bonding pad region provided with a bonding pad and a fuse region provided with a fuse, an insulating layer provided on the substrate and including a bonding pad opening exposing the bonding pad and a fuse opening exposing the fuse region, a connection terminal provided in the bonding pad region and electrically connected to the bonding pad, and a protection layer provided on the insulating layer including a first protection layer provided within the bonding pad region and a second protection layer in the fuse opening.

16 Claims, 14 Drawing Sheets

(52) U.S. Cl.
H01L 2224/16227 (2013.01); H01L 2224/0401 (2013.01); H01L 2224/13006 (2013.01); H01L 2224/13022 (2013.01); H01L 2224/13111 (2013.01); H01L 2224/05572 (2013.01); H01L 23/3178 (2013.01); H01L 2224/10126 (2013.01); H01L 2224/02126 (2013.01); H01L 25/0657 (2013.01); H01L 2224/05022 (2013.01); H01L 2224/1312 (2013.01); H01L 2224/05541 (2013.01); H01L 2224/13139 (2013.01); H01L 2224/13118 (2013.01); H01L 2224/13109 (2013.01); H01L 2224/05558 (2013.01)
USPC ..... 257/529; 257/734; 257/737; 257/E23.149

(56) References Cited

U.S. PATENT DOCUMENTS

| | | |
|---|---|---|
| 7,141,885 B2 | 11/2006 | Kim |
| 7,157,796 B2 | 1/2007 | Yamagata |
| 8,120,176 B2 | 2/2012 | Shin et al. |
| 2002/0135055 A1* | 9/2002 | Cho et al. ................. 257/678 |
| 2003/0027379 A1* | 2/2003 | Liu ........................... 438/132 |
| 2004/0114294 A1* | 6/2004 | Tong et al. ................ 361/104 |
| 2007/0284702 A1* | 12/2007 | Im ............................. 257/649 |
| 2009/0001570 A1 | 1/2009 | Yamano |
| 2009/0267181 A1* | 10/2009 | Miyake et al. ............ 257/529 |
| 2010/0187688 A1 | 7/2010 | Hochstenbach |
| 2010/0207271 A1 | 8/2010 | Omi |
| 2012/0061823 A1* | 3/2012 | Wu et al. .................. 257/737 |

* cited by examiner

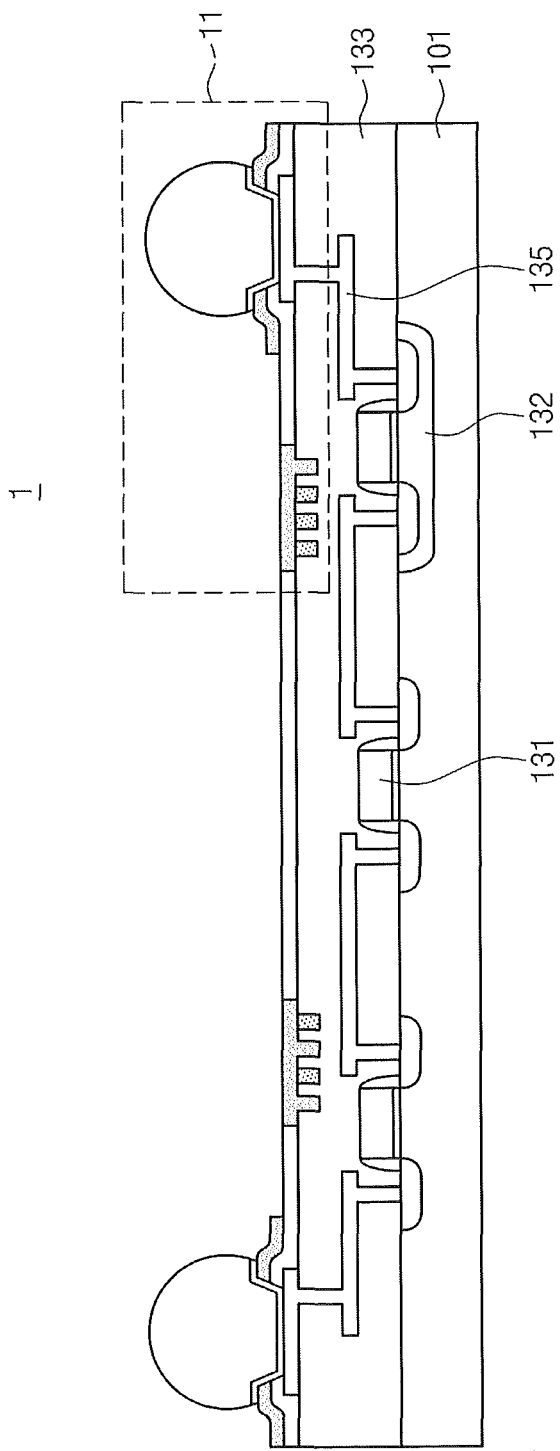

ELECTRICAL INTERCONNECTION STRUCTURES INCLUDING STRESS BUFFER LAYERS

CROSS-REFERENCE TO RELATED APPLICATIONS

This U.S. non-provisional patent application claims priority under 35 U.S.C. §119 to Korean Patent Application No. 10-2012-0063075, filed on Jun. 13, 2012, in the Korean Intellectual Property Office, the entire contents of which are hereby incorporated by reference.

BACKGROUND OF THE INVENTION

Example embodiments of the inventive concept are directed to semiconductor devices, and in particular, to electrical connection structures of semiconductor devices and methods of fabricating the same.

In general, a semiconductor device may have an electrical connection structure (such as solder balls or bumps) so as to be electrically connected to another semiconductor device and/or a printed circuit board. The electrical connection structures of semiconductor devices may be developed to meet technical requirements, such as higher reliability and improved electric connection stability.

SUMMARY

Example embodiments of the inventive concept provide an electrical connection structure with higher reliability and improved electric connection stability and a method of fabricating the same.

According to example embodiments of the inventive concept, an electrical connection structure may include a stress buffer layer provided around a solder ball or bump. Furthermore, a capping layer on or covering a fuse opening may be formed using the formation of the stress buffer layer.

According to some example embodiments, the electrical connection structure may include a substrate including a first region provided with a bonding pad and a second region provided with a fuse, an insulating layer provided on the substrate including a first opening which exposes the bonding pad and a second opening which exposes the fuse, a connection terminal disposed in the first region and electrically connected to the bonding pad, and a protection layer provided on the insulating layer including a first layer which is disposed within the first region and a second layer which fills the second opening.

In example embodiments, the second region may further include a fuse cutting region formed by cutting the fuse.

In example embodiments, the second layer further fills the fuse cutting region.

In example embodiments, the insulating layer may include a silicon oxide, silicon nitride, or any combination thereof, and the protection layer may include polyimide resin.

In example embodiments, the first layer may be partially overlapped with the connection terminal.

In example embodiments, the first layer may be provided at an outside of the connection terminal to surround a lower side surface of the connection terminal.

In example embodiments, the first layer extends into the first opening to cover the insulating layer in the first opening.

In example embodiments, the connection terminal may include one of a solder ball, a bump pillar, and a bump pillar whose top surface is covered with a solder.

According to further example embodiments of the inventive concept, a method of fabricating an electrical connection structure may include providing a substrate including a first region provided with a bonding pad a second region provided with a fuse; forming an insulating layer on the substrate to include a first opening exposing the bonding pad and a second opening exposing the fuse; forming a first protection layer to surround the first opening; forming a second protection layer to fill the second opening; and forming a connection terminal electrically connected to the bonding pad.

In example embodiments, the first protection layer and the second protection layer may be formed using the same process.

In example embodiments, the formation of the first protection layer may include coating a polymer layer on the entire top surface of the substrate, and then, patterning the polymer layer to form the first protection layer on the insulating layer. The first protection layer may be locally formed within the first region to surround the first opening.

In example embodiments, the formation of the second protection layer may include forming the second protection layer within the second region. The second protection layer may be formed using the process of patterning the polymer layer to form the first protection layer.

In example embodiments, the formation of the insulating layer may include depositing one of a silicon oxide layer, a silicon nitride layer, or any combination thereof, on the substrate.

In example embodiments, the method may further include cutting the fuse exposed by the second opening to form a fuse cutting region in the second region.

In example embodiments, the second protection layer may be formed to fill the fuse cutting region.

According to still further example embodiments of the inventive concepts, an electrical connection structure may include a substrate including a bonding pad region provided with a bonding pad, an insulating layer provided on the substrate partially exposing the bonding pad, a connection terminal provided in the bonding pad region and electrically connected to the bonding pad, and a protection layer provided on the insulating layer and partially overlapped with the connection terminal.

In example embodiments, the insulating layer may include a bonding pad opening which exposes the bonding pad. The bonding pad opening may have an area smaller than an overlap area between the connection terminal and the protection layer.

In example embodiments, the area of the bonding pad opening ranges from 10 to 90 percent of the overlap area between the connection terminal and the protection layer.

In example embodiments, the protection layer may be provided below the connection terminal and at an outside of the bonding pad opening, such that a top surface of the insulating layer may be covered with the protection layer and a side surface of the insulating layer may be not covered with the protection layer.

In example embodiments, the protection layer may be provided below the connection terminal to extend into the bonding pad opening, such that top and side surfaces of the insulating layer may be covered with the protection layer.

In example embodiments, the protection layer may be provided below the connection terminal to extend into the bonding pad opening, thereby covering top and side surfaces of the insulating layer and a portion of the bonding pad exposed by the bonding pad opening.

In example embodiments, the substrate may further include a fuse region provided with a fuse, and the protection layer may discretely extend on the substrate to cover the bonding pad region and the fuse region.

According to yet further example embodiments, an electrical connection structure includes a substrate having a conductive bonding pad thereon, an insulating layer on the substrate including an opening therein exposing the bonding pad, a protection layer on the insulating layer and extending around a periphery of the opening therein, wherein a surface of the insulating layer outside the periphery of the opening is free of the protection layer, and a conductive structure electrically contacting the conductive bonding pad through the opening, where at least one surface of the conductive structure is supported by the protection layer.

In example embodiments, the electrical connection structure may further include a fuse on the substrate in a region thereof adjacent to the conductive bonding pad. The surface of the insulating layer that is free of the protection layer may extend between the periphery of the opening and the fuse.

In example embodiments, the protection layer around the periphery of the opening in the insulating layer may be a first protection layer, and the electrical connection structure may further include a second protection layer on the fuse.

In example embodiments, the fuse may include a cut region having a discontinuity therein. The discontinuity may result from cutting of the fuse in a repair process. The second protection layer may extend into the cut region.

In example embodiments, the insulating layer may be an inorganic material, such as silicon nitride or silicon oxide, and the protection layer may be an organic material, such as polyimide.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 3A is a sectional view of a semiconductor device including an electrical connection structure according to example embodiments of the inventive concept.

Figure 1A:
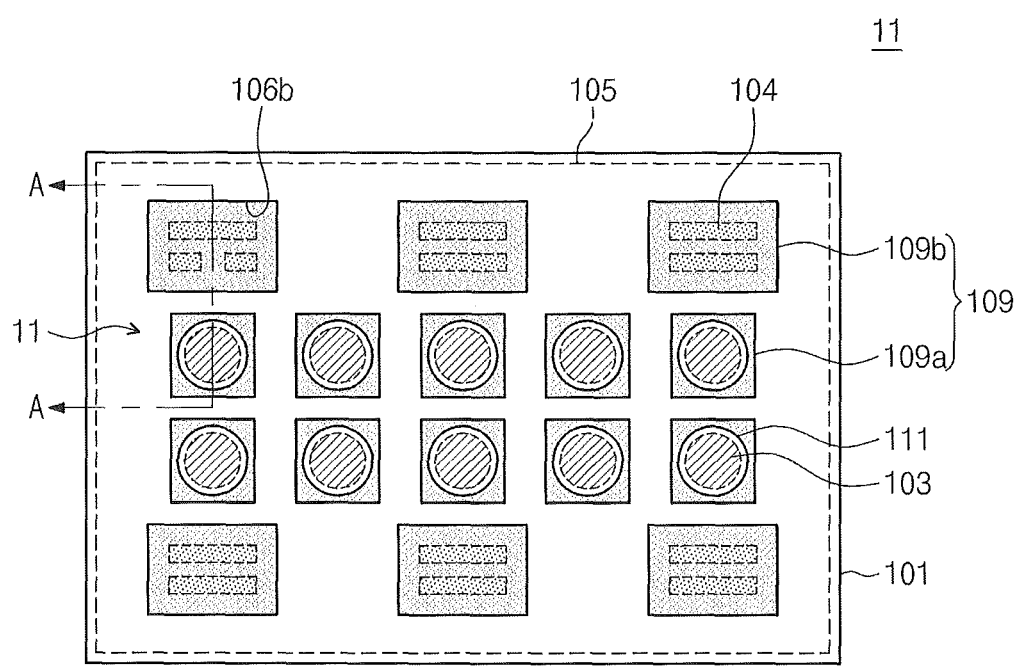
FIG. 1A is a plan view illustrating an electrical connection structure according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
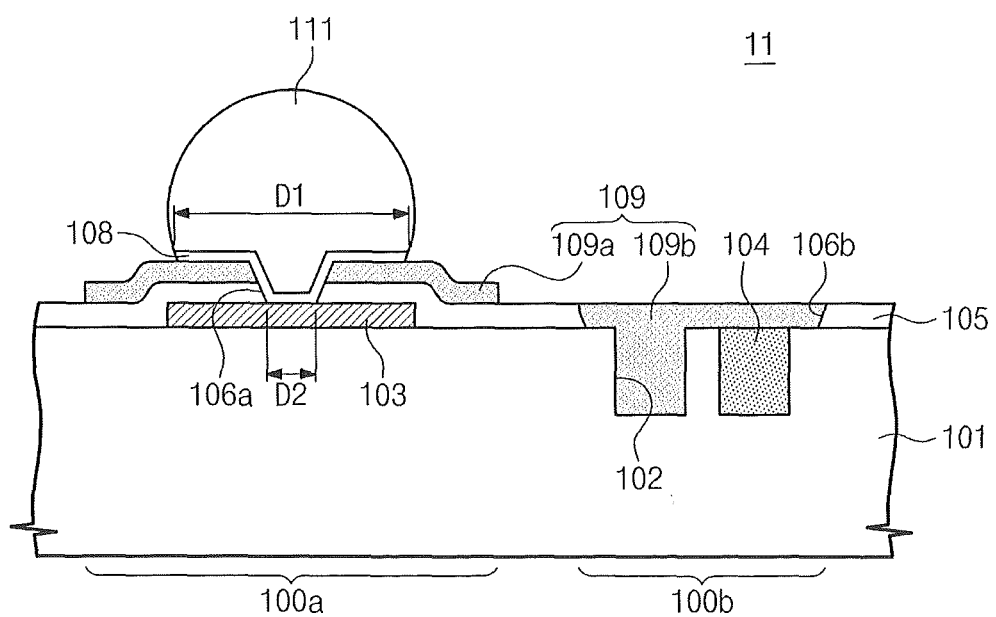
FIG. 1B is a sectional view taken along a line A-A of FIG. 1A.

FIG. 1A is a plan view illustrating an electrical connection structure according to example embodiments of the inventive concept. FIG. 1B is a sectional view taken along a line A-A of FIG. 1A.

Referring to FIG. 1A, a first electrical connection structure 11 may include a substrate 101 provided with a bonding pad 103 and a fuse 104 and partially covered with an upper insulating layer 105, a solder ball 111 provided on the substrate 101 and electrically connected to the bonding pad 103, and a protection layer 109 including a first protection layer 109a provided around the solder ball 111 and a second protection layer 109b on or covering a fuse opening 106b. A plurality of bonding pads 103 may be arranged on a cell region of the substrate 101, and a plurality of fuses 104 may be arranged on a peripheral circuit region of the substrate 101. A plurality of bonding pads 103 may be arranged on a central region of the substrate 101. The upper insulating layer 105 may be patterned to define a plurality of bonding pad openings 106a not shown in FIG. 1A exposing portions (e.g., the central regions) of the bonding pads 103, respectively. The arrangement of the bonding pad 103 and the fuse 104 shown in FIG. 1A is provided by way of example, and embodiments of the inventive concept may not be limited thereto.

Referring to FIG. 1B, the substrate 101 may include a bonding pad region 100a provided with the bonding pad 103 and a fuse region 100b provided with the fuse 104. The bonding pad region 100a may be a part of the cell region, and the fuse region 100b may be a part of the peripheral circuit region. An under-bump metal layer 108 may be further provided on the bonding pad 103. The under-bump metal layer 108 and the solder ball 111 may define a conductive structure that is electrically connected to the bonding pad 103. The upper insulating layer 105 may be provided on the substrate 101 and may be patterned to expose the bonding pad 103 and the fuse 104, and the protection layer 109 may be provided on the upper insulating layer 105. The upper insulating layer 105 may include at least one of inorganic layers (e.g., a silicon nitride layer, a silicon oxide layer, or any combination thereof). The protection layer 109 may include at least one of organic layers such as polymer layers (e.g., a polyimide layer). The protection layer 109 may be locally provided on the bonding pad region 100a and the fuse region 100b such that the protection layer 109 may partially cover the upper insulating layer 105. For example, the first protection layer 109a may be provided on the upper insulating layer 105 overlapped with the solder ball 111. The second protection layer 109b may be formed to fill the fuse opening 106b. Some of the fuses 104 may be cut by a repair process to form a cutting region 102. The cutting region 102 may be filled with the second protection layer 109b. For example, as shown in FIG. 1B, one of two fuses 104 is cut, while the other is not cut. Since the fuse 104 is cut according to need, the second protection layer 109b may be formed to cover two fuses 104 or fill the cutting regions 102 delimited by two cut fuses 104.

The first protection layer 109a may be provided on the upper insulating layer 105, such that the bonding pad opening 106a may not be covered by the first protection layer 109a. For example, the first protection layer 109a may be formed on the upper insulating layer 105 to surround an edge or periphery of the bonding pad 103 and expose the central region of the bonding pad 103 exposed by the bonding pad opening 106a. The exposed central region of the bonding pad 103 may be electrically connected to the solder ball 111 through the opening 106a. A dimension (hereinafter, referred to as a "second dimension D2") of the bonding pad opening 106a may be smaller than a dimension (hereinafter, referred to as a "first dimension D1") of the solder ball 111 that is overlapped with a top surface of the first protection layer 109a. For example, the second dimension D2 may range from about 10% to about 90% of the first dimension D1. As the second dimension D2 decreases, a surface area (e.g., in contact with the solder ball 111) of the first protection layer 109a may increase.

In the case where the first electrical connection structure 11 is used for a chip bonding process, a stress may be concentrated on the bonding pad 103. As a result, the substrate 101 may be warped by the stress, or a crack may occur around the bonding pad 103 and/or between the solder ball 111 and the bonding pad 103. In example embodiments, the first protection layer 109a may serve as a stress buffer layer relieving the stress, and thus, it is possible to suppress the substrate 101 from warping and/or cracking. In addition, since the first protection layer 109a is overlapped with and physically supports the solder ball 111, the first protection layer 109a may enable to reduce a stress exerted from the solder ball 111 during a chip bonding process. Due to the presence of the first protection layer 109a serving as the stress buffer layer, it is possible to suppress circuits integrated on the substrate 101 or a brittle dielectric layer (e.g., ultra-low k dielectric) from being degraded by a stress. The second protection layer 109b may serve as a capping layer on or covering the fuse 104 and/or filling a fuse cutting region 102, and thus, it is possible to suppress the fuse 104 from being stressed or contaminated.

FIGS. 2A through 2G are sectional views illustrating electrical connection structures according to other example embodiments of the inventive concept.

Figure 2A:
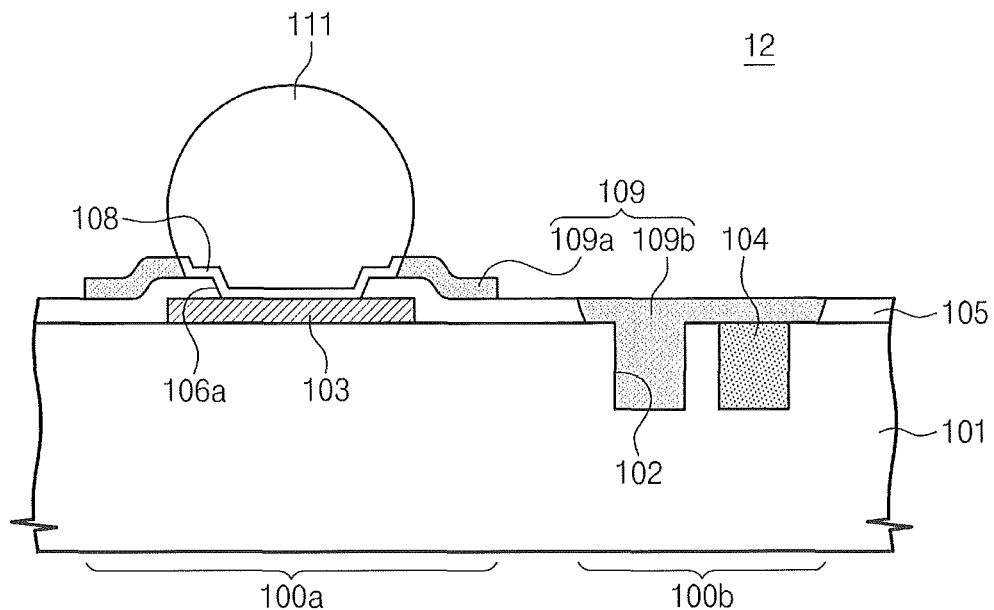
FIGS. 2A through 2G are sectional views illustrating electrical connection structures according to further example embodiments of the inventive concept.

Referring to FIG. 2A, a second electrical connection structure 12 may include the first protection layer 109a provided around the solder ball 111 adjacent a sidewall thereof. For example, the first protection layer 109a may not be overlapped with the solder ball 111 and may have a curved shape extending toward an outside of the bonding pad 103. Accordingly, each of the upper insulating layer 105 and the first protection layer 109a may include stepwise structures formed on the bonding pad 103.

Figure 2B:
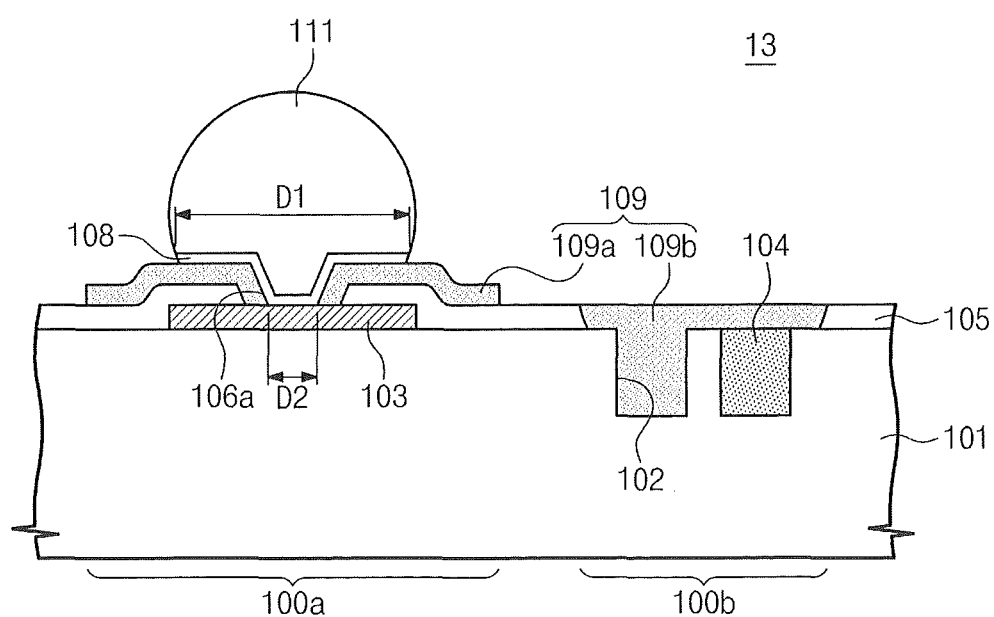

Referring to FIG. 2B, a third electrical connection structure 13 may include the first protection layer 109a provided to cover the upper insulating layer 105. For example, the first protection layer 109a may extend toward a central portion of the bonding pad 103 and cover a side surface or sidewall of the upper insulating layer 105 that defines the opening 106a therein. Accordingly, an overlapped area or contact area between the first protection layer 109a and the solder ball 111 may be increased. Since the first protection layer 109a extends toward the central portion of the bonding pad 103, the bonding pad opening 106a may have a reduced second dimension D2, compared with the case where the first protection layer 109a is formed not to cover the bonding pad 103.

Figure 2C:
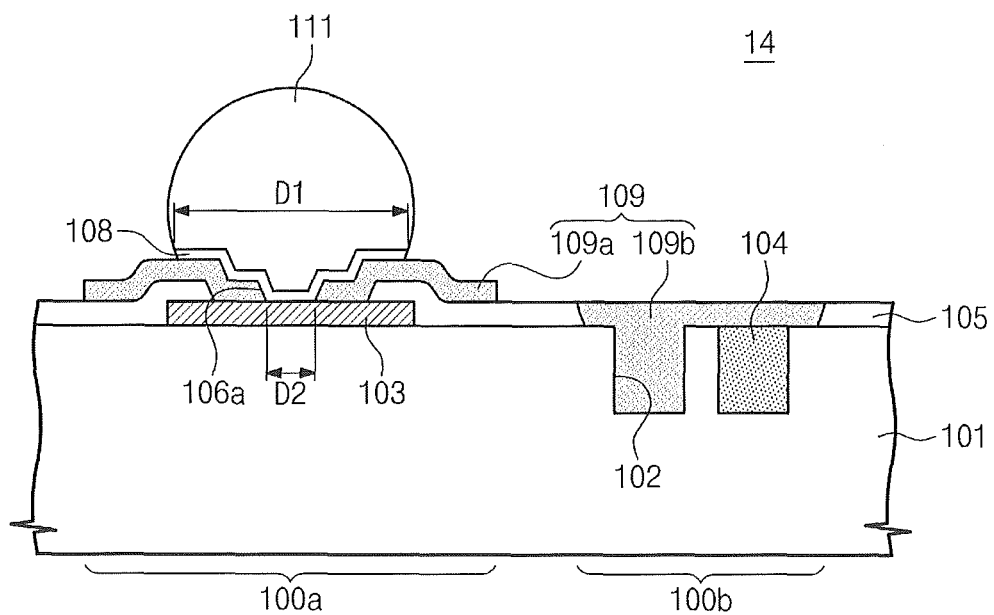

Referring to FIG. 2C, a fourth electrical connection structure 14 may include the first protection layer 109a on or covering the upper insulating layer 105 and extending toward the bonding pad 103. In example embodiments, the first protection layer 109a may have a stepwise structure on or covering a central portion of the bonding pad 103. For example, the first protection layer 109a may have an V-shaped portion covering a side surface of the upper insulating layer 105 and a top surface of the bonding pad 103, and the bonding pad opening 106a may have a second dimension D2 that is reduced by the 'L'-shaped portion of the first protection layer 109a.

Figure 2D:
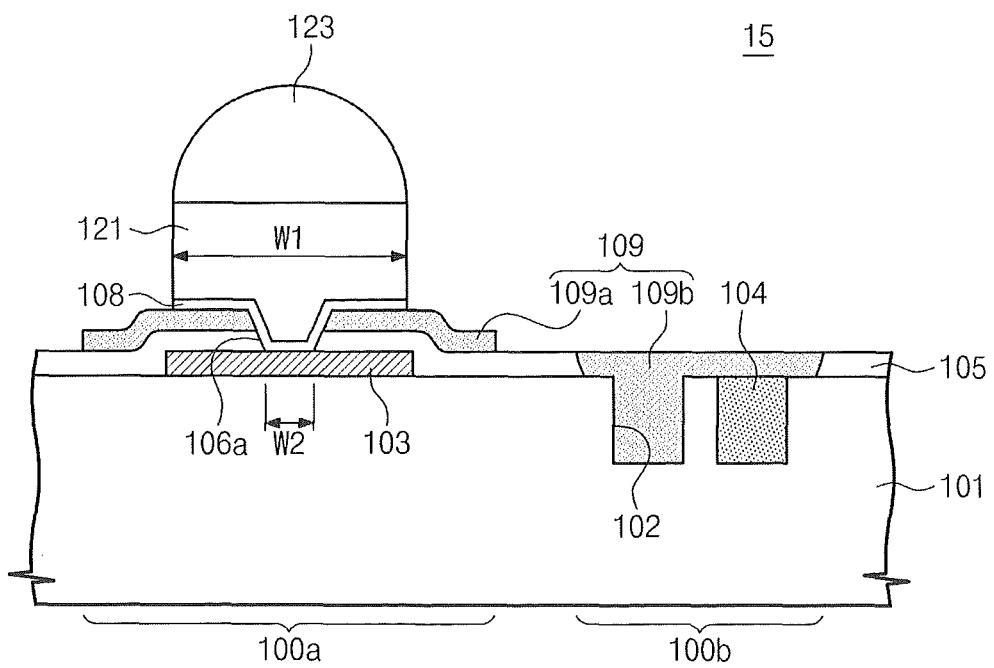

Referring to FIG. 2D, a fifth electrical connection structure 15 may include a bump pillar 121. For example, the bump pillar 121 may be provided on the substrate 101 and be electrically connected to the bonding pad 103, and a solder 123 may be provided on the bump pillar 121. The under bump metal layer 108, the bump pillar 121, and the solder 123 may define a conductive structure. The first protection layer 109a may be formed to cover the upper insulating layer 105 such that the first protection layer 109a may be overlapped with the bump pillar 121. According to the present embodiment, the first protection layer 109a may be formed on an edge portion of the bonding pad 103, and thus, the first protection layer 109a may expose a central portion of the bonding pad 103 exposed by the bonding pad opening 106a. The bump pillar 121 may be shaped like, for example, a circular or cylindrical pillar with a first width W1, and the bonding pad opening 106a may be shaped like a circular hole having a second width W2 less than the first width W1. The second width W2 may be in a range from about 10% to about 90% of the first width W1. The first width W1 may be a diameter of an overlapped region between the bump pillar 121 and the first protection layer 109a.

Figure 2E:
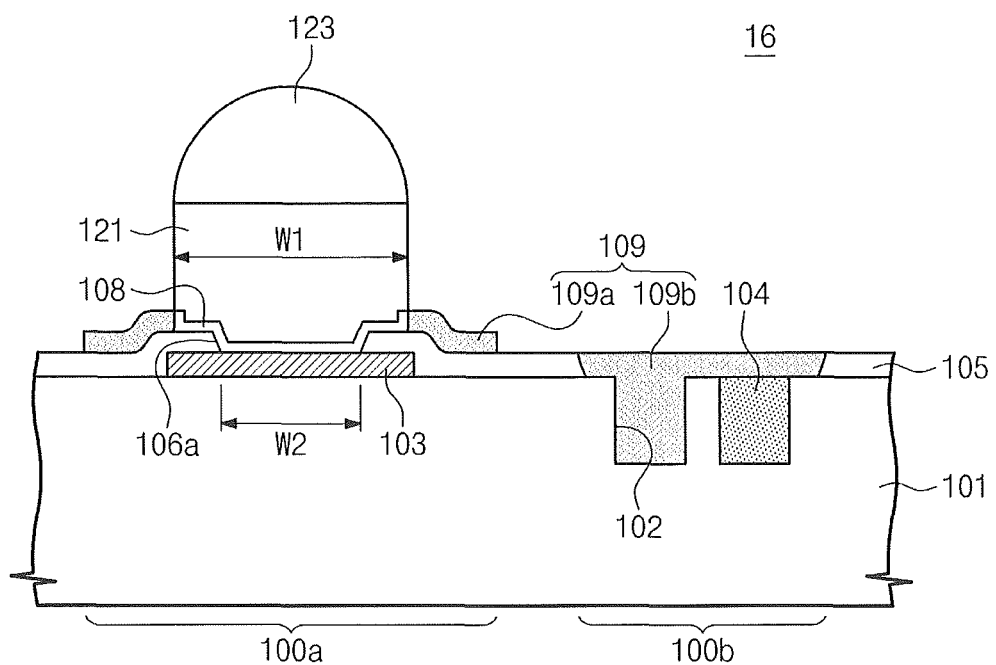

Referring to FIG. 2E, a sixth electrical connection structure 16 may include the first protection layer 109a provided around the bump pillar 121 adjacent a sidewall thereof. For example, the first protection layer 109a may not be overlapped with the bump pillar 121 and have a curved shape extending toward an outside of the bonding pad 103. Accordingly, each of the upper insulating layer 105 and the first protection layer 109a may include a stepwise portion formed on the bonding pad 103.

Figure 2F:
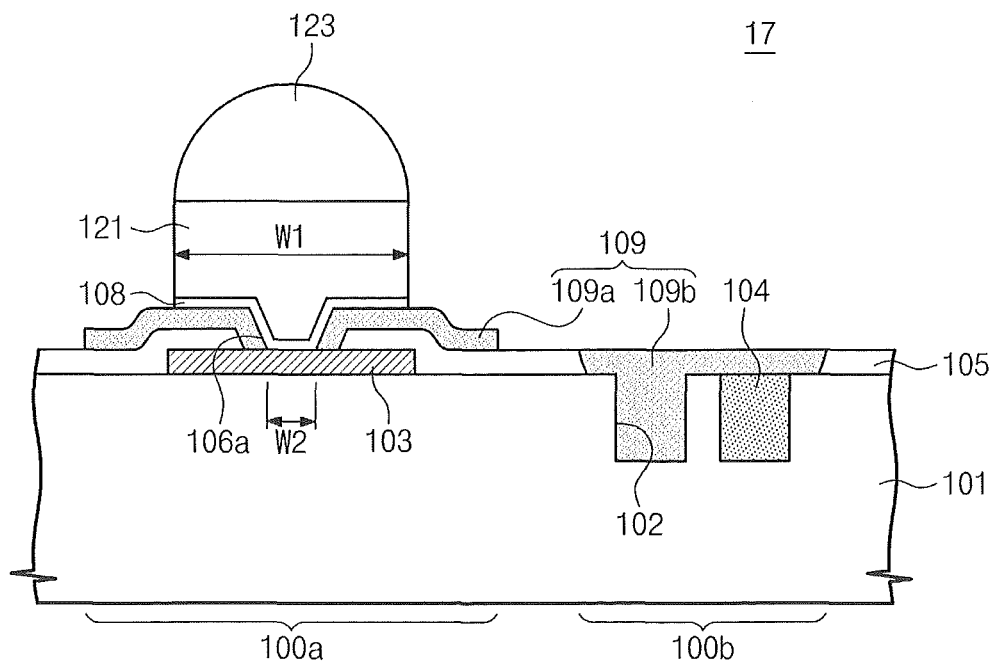

Referring to FIG. 2F, a seventh electrical connection structure 17 may include the first protection layer 109a which is overlapped with the bump pillar 121 and covers a side surface or sidewall of the upper insulating layer 105 that defines the opening 106 therein. Since the first protection layer 109a is formed to cover a portion of the bonding pad 103, the second width W2 of the bonding pad opening 106a may be reduced, compared with the case that the first protection layer 109a is formed not to cover the bonding pad 103.

Figure 2G:
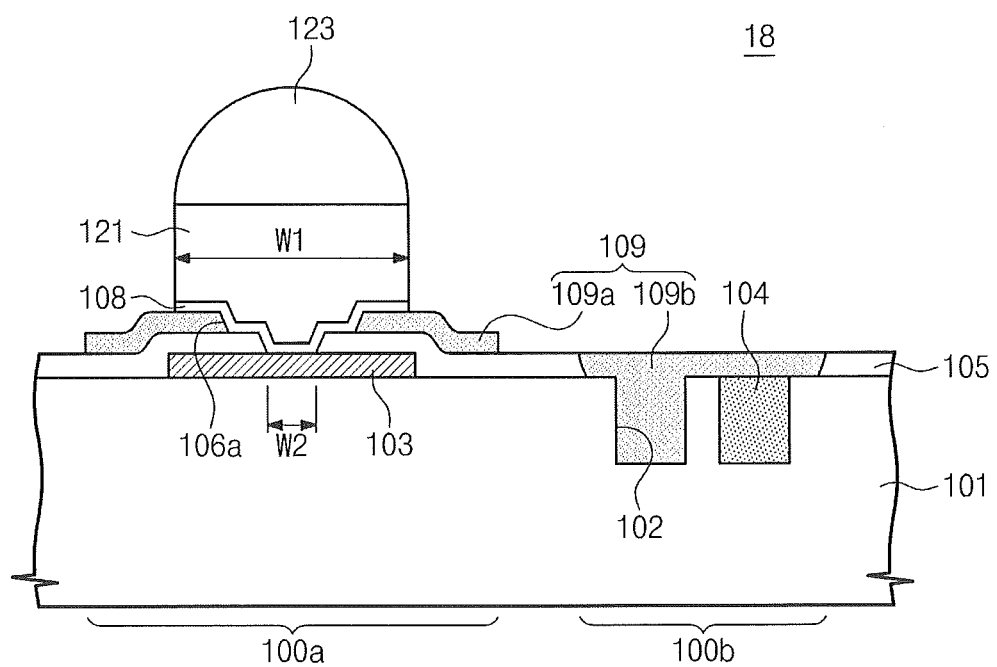

Referring to FIG. 2G, an eighth electrical connection structure 18 may include the first protection layer 109a on or covering the upper insulating layer 105 and including a stepwise portion extending toward the bonding pad 103. Accordingly, the first protection layer 109a may include an 'L'-shaped portion covering a central portion of the bonding pad 103, and the bonding pad opening 106a may have a second width W2 that is reduced by the 'L'-shaped portions of the first protection layer 109a.

Figure 3B:
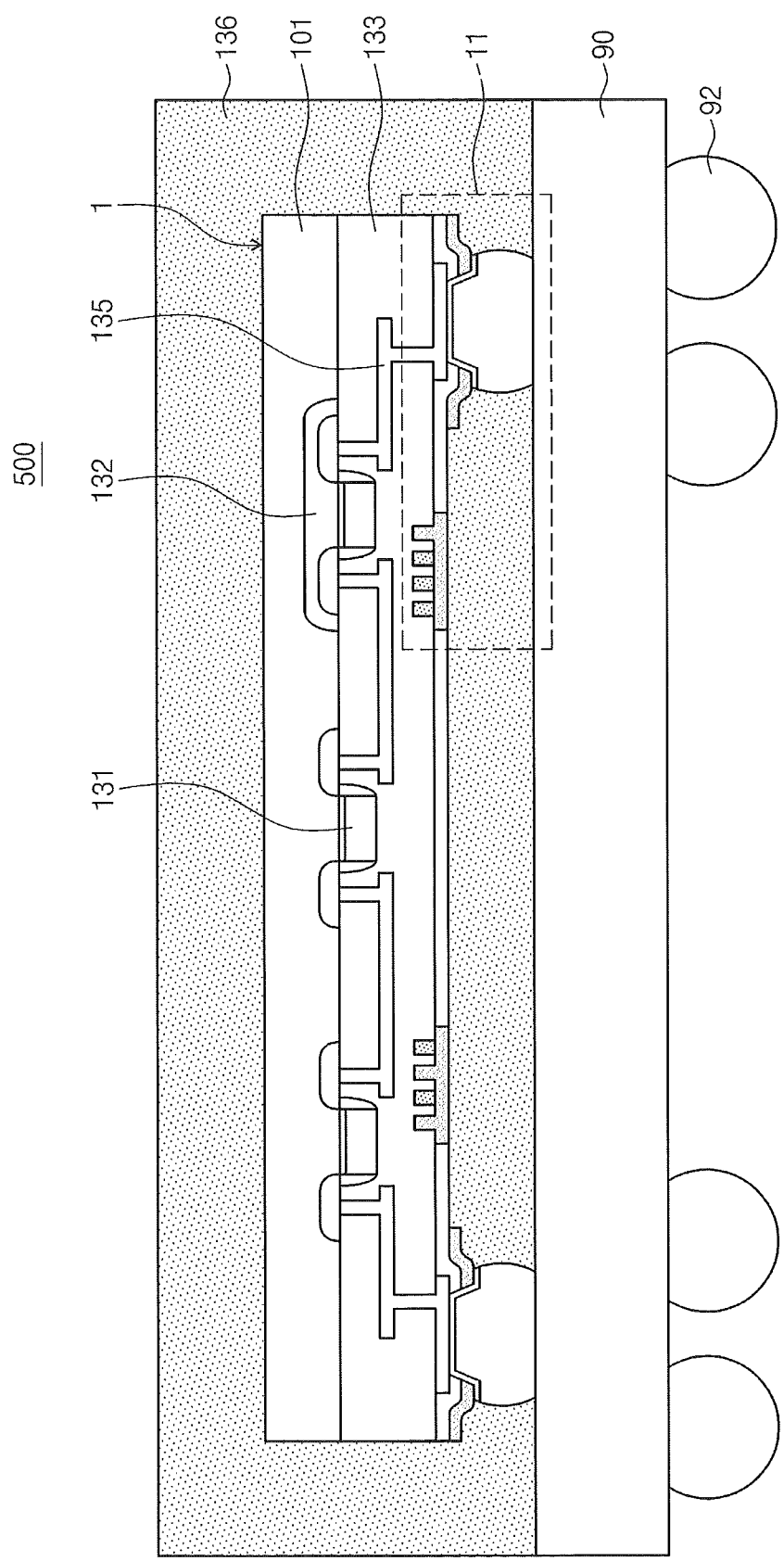
FIG. 3B is a sectional view of a semiconductor package, in which a semiconductor device including an electrical connection structure according to example embodiments of the inventive concept is packaged.
Figure 3C:
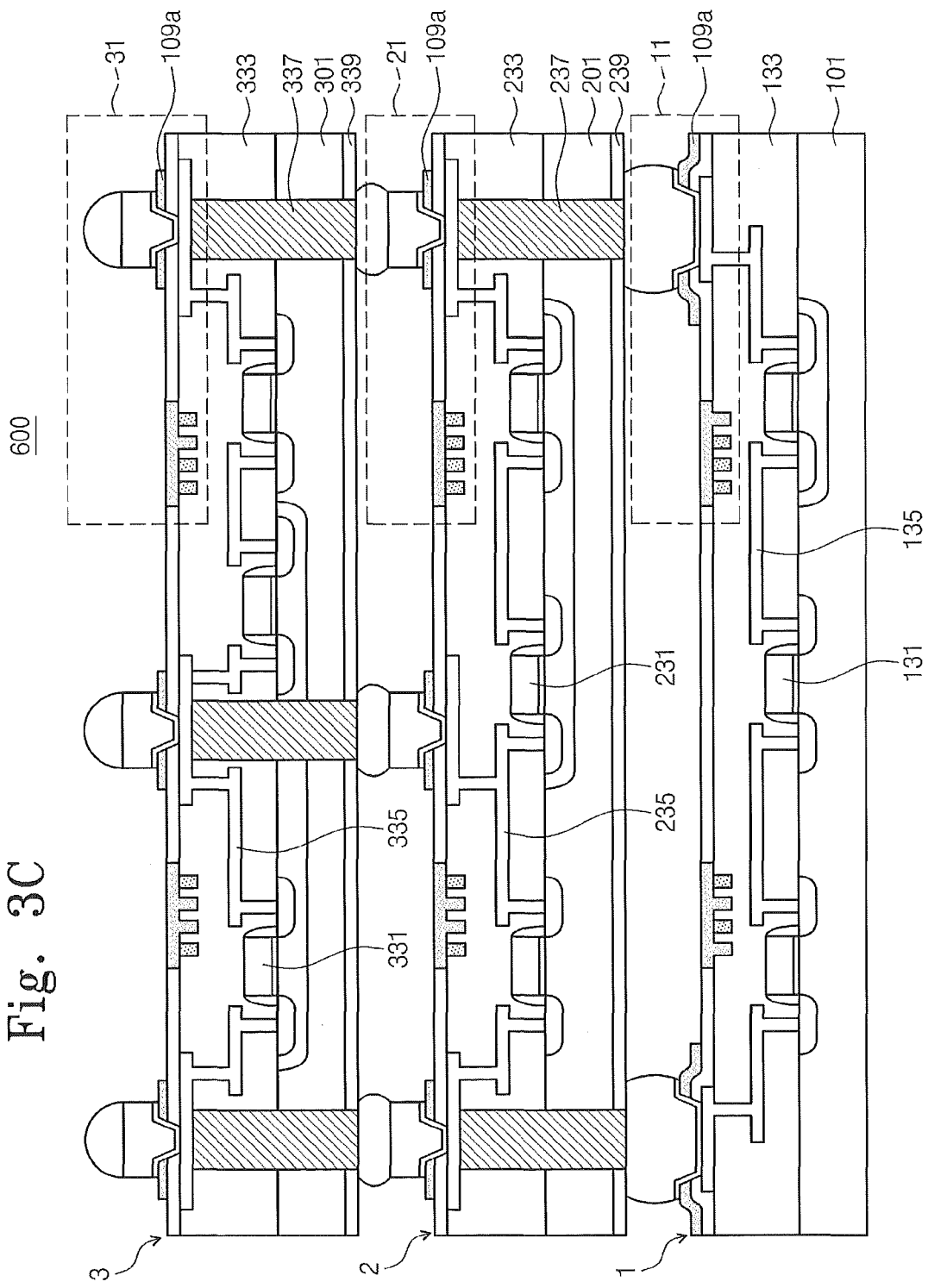
FIG. 3C is a sectional view illustrating a chip stack, in which semiconductor devices according to example embodiments of the inventive concept are stacked.

FIG. 3A is a sectional view of a semiconductor device provided with an electrical connection structure according to example embodiments of the inventive concept. FIG. 3B is a sectional view of a semiconductor package, in which a semiconductor device including an electrical connection structure according to example embodiments of the inventive concept is packaged. FIG. 3C is a sectional view illustrating a chip stack, in which semiconductor devices according to example embodiments of the inventive concept are stacked.

Referring to FIG. 3A, a semiconductor device 1 may be a memory device, a logic device, and/or a hybrid device having the memory and logic elements, in which the first electrical connection structure 11 is provided. The semiconductor device 1 may include transistors 131 provided on the substrate 101 and covered with an interlayer insulating layer 133, and at least one of the transistors 131 may be electrically connected to the first electrical connection structure 11 via a metal wire 135. At least one of the transistors 131 may be provided on a well region 132. For example, the transistors 131 may include at least one PMOS transistor provided on the well region 132 and at least one NMOS transistor provided outside of the well region 132 on the substrate 101, or vice versa. In certain embodiments, the first electrical connection structure 11 may be replaced with (or provided in addition to) one of the second to eighth electrical connection structures 12 to 18.

Referring to FIG. 3B, the semiconductor device 1 may be mounted on a package substrate 90 to constitute or define a semiconductor package 500. For example, the semiconductor device 1 may be mounted on the package substrate 90 in a flipped manner such that the first electrical connection structure 11 faces the package substrate 90, and a molding layer 136 may be provided to mold the semiconductor device 1 mounted on the package substrate 90. The package substrate 90 may further include solder balls 92 which may be used to provide an electrical pathway or connection to an external device (e.g., another semiconductor package or a module of electronic device (such as a computer or a cellular phone)).

Referring to FIG. 3C, the semiconductor device 1 may be electrically connected to one or more semiconductor devices 2 and 3 to constitute or define a chip stack 600. The chip stack 600 may be mounted on the package substrate 90 of FIG. 3B to constitute or define an electronic system. In example embodiments, the chip stack 600 may include the semiconductor device 1 (hereinafter, referred to as a "first semiconductor device"), a second semiconductor device 2 stacked on the first semiconductor device 1, and a third semiconductor device 3 stacked on the second semiconductor device 2. At least one of the second and third semiconductor devices 2 and 3 may include at least one of the first to eighth electrical connection structures 11 to 18.

For example, the second semiconductor device 2 may include second transistors 231 provided on a second substrate 201 and covered with a second interlayer insulating layer 233, and at least one of the second transistors 231 may be electrically connected to an electrical connection structure 21 via a second metal wire 235. The electrical connection structure 21 of the second semiconductor device 2 may be provided by one of the first to eighth electrical connection structures 11 to 18. In addition, the second semiconductor device 2 may further include a through electrode 237 and a lower insulating layer 239. The through electrode 237 may be electrically connected to the electrical connection structure 21. The through electrode 237 may extend through the lower insulating layer 239 to be electrically connected to the first electrical connection structure 11 of the first the semiconductor device 1, such that the first the semiconductor device 1 may be electrically connected to the second semiconductor device 2. In certain embodiments, due to the presence of the first protection layer 109a of the electrical connection structure 21, it is possible to relieve a stress which may be exerted to the second semiconductor device 2 when the first and second semiconductor devices 1 and 2 are bonded to each other. The first protection layer 109a of the first electrical connection structure 11 may be configured to relieve a stress from the through electrode 237 and/or by other factors and is exerted to the first the semiconductor device 1. In addition, for the second semiconductor device 2, the first protection layer 109a of the electrical connection structure 21 may enable to relieve or reduce a warpage effect of the second semiconductor device 2.

The third semiconductor device 3 may include third transistors 331 provided on a third substrate 301 and covered with a third interlayer insulating layer 333, and at least one of the third transistors 331 may be electrically connected to an electrical connection structure 31 via a third metal wire 335. The electrical connection structure 31 of the third semiconductor device 3 may be one of the first to eighth electrical connection structures 11 to 18. The third semiconductor device 3 may further include a through electrode 337 and a lower insulating layer 339. The through electrode 337 may be electrically connected to the electrical connection structure 31. The through electrode 337 extend through the lower insulating layer 339 to be electrically connected to the electrical connection structure 21 of the second semiconductor device 2 such that the second and third semiconductor devices 2 and 3 may be electrically connected to each other. In certain embodiments, due to the presence of the first protection layer 109a of the electrical connection structure 21, it is possible to relieve a stress which is exerted to the second semiconductor device 2. For example, the stress may be produced from one of the through electrodes 237 and 337 and/or by other factors, when the second and third semiconductor devices 2 and 3 are bonded to each other. For the third semiconductor device 3, the first protection layer 109a of the electrical connection structure 31 may be configured to reduce or relieve a warpage effect of the third semiconductor device 3. In addition, the first protection layer 109a of the electrical connection structure 31 may enable to relieve a stress which is exerted to the third semiconductor device 3 when other semiconductor device is stacked on the third semiconductor device 3.

FIGS. 4A through 4E are sectional views illustrating a method of fabricating an electrical connection structure according to example embodiments of the inventive concept.

Figure 4A:
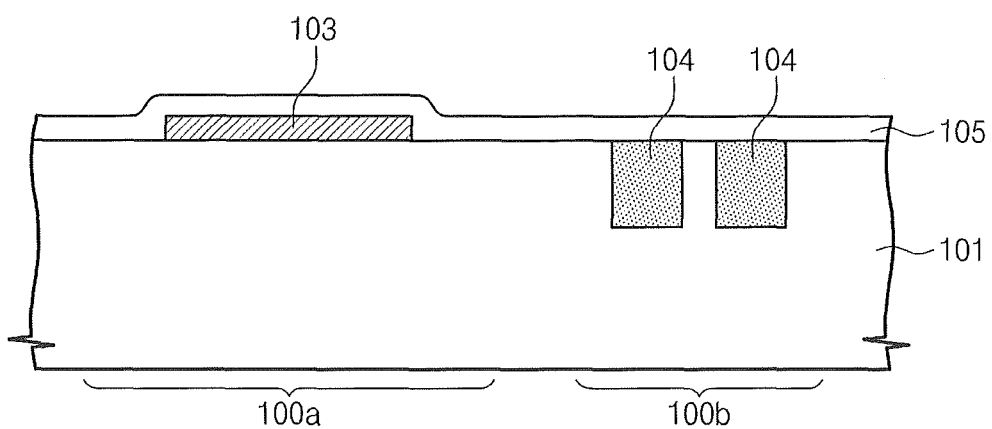
FIGS. 4A through 4E are sectional views illustrating methods of fabricating an electrical connection structure according to example embodiments of the inventive concept.

Referring to FIG. 4A, the upper insulating layer 105 may be formed on the substrate 101 provided with the bonding pad 103 and the fuse 104. The substrate 101 may be a semiconductor substrate such as a chip-level or wafer-level silicon. The substrate 101 may include the bonding pad region 100a in which the bonding pad 103 may be formed and the fuse region 100b in which the fuse 104 may be formed. For example, the bonding pad region 100a may be a portion of a cell region, and the fuse region 100b may be a portion of a peripheral circuit region. The bonding pad 103 and the fuse 104 may be formed by depositing and patterning a metal layer (e.g., of aluminum or copper) or by performing a plating process. The upper insulating layer 105 may be formed by depositing a silicon oxide layer, a silicon nitride layer, or any combination thereof. The upper insulating layer 105 may be a single-layer or multi-layered structure.

Figure 4B:
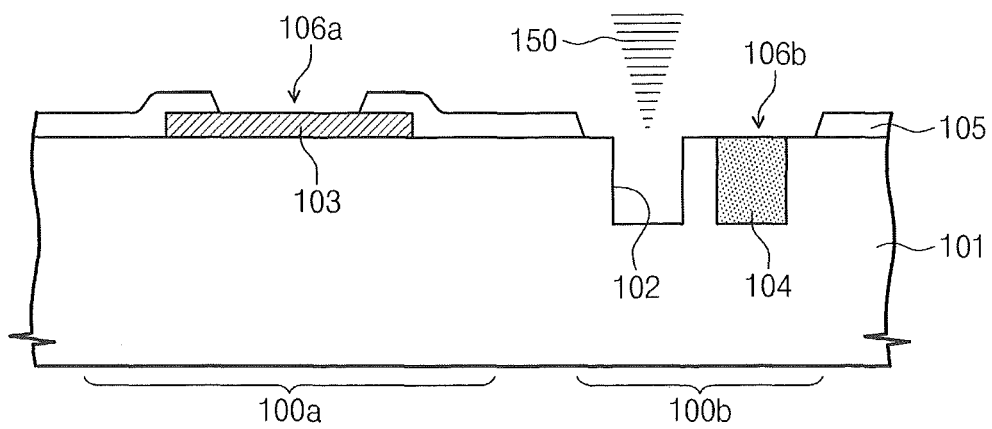

Referring to FIG. 4B, the upper insulating layer 105 may be patterned to form the bonding pad opening 106a exposing the bonding pad 103 in the bonding pad region 100a and/or to form the fuse opening 106b exposing the fuse 104 in the fuse region 100b. A test apparatus may be used to determine whether the resulting structure has an operational error or other defect. According to the test result, the fuse 104 may be selectively cut. In the case where the resulting structure has an operational error, a repair process may be performed. In the repair process, for example, the fuse 104 connected to a failed cell may be cut using a laser 150 illuminated on the fuse opening 106b and be replaced with a redundancy or redundant cell. As the result of the repair process, the fuse cutting region 102 may be formed in the substrate 101. In the case of the absence of the repair process, the fuse cutting region 102 may not be formed in the substrate 101.

Figure 4C:
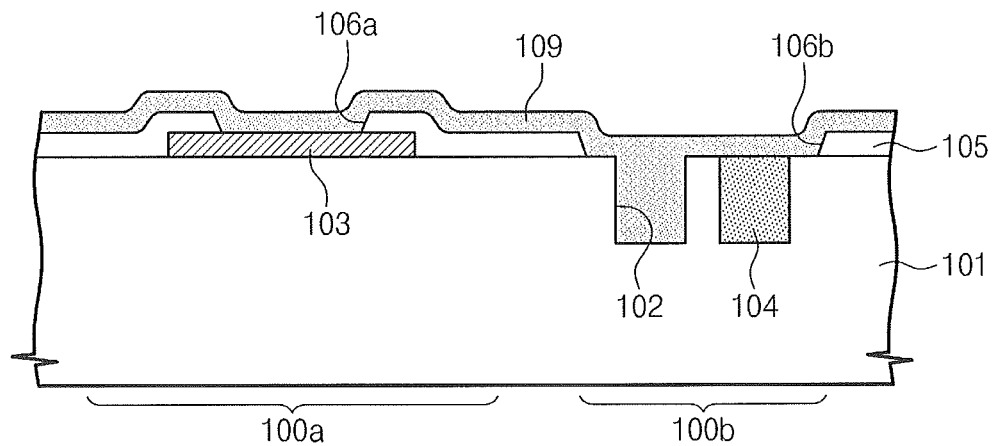

Referring to FIG. 4C, the protection layer 109 may be formed on the substrate 101. The protection layer 109 may be formed by coating a polymer layer (e.g., polyimide base resin). For example, the polyimide base resin may be one of polyimide, polyether imide, polyether ketone, or polyester imide. The protection layer 109 may be formed to cover the upper insulating layer 105 and/or fill the bonding pad opening 106a and the fuse opening 106b. In the case where the fuse cutting region 102 is formed, the protection layer 109 may be formed to fill the fuse cutting region 102.

Figure 4D:
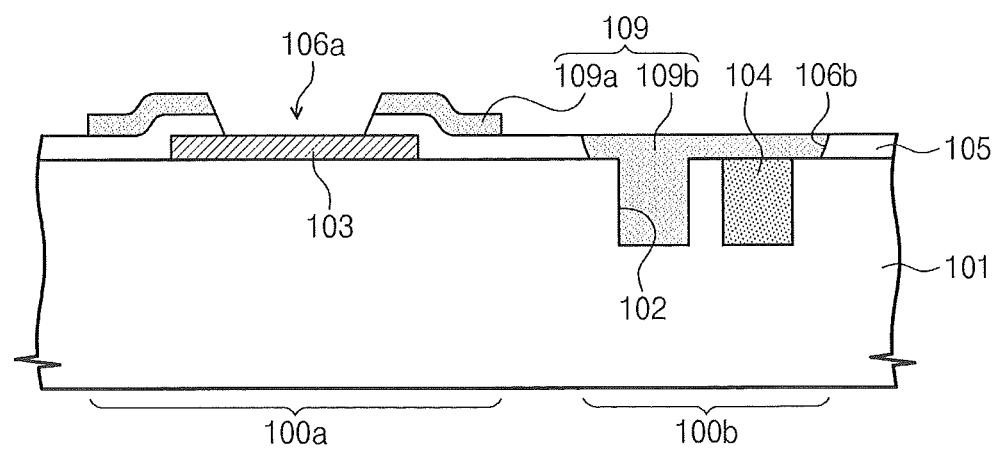

Referring to FIG. 4D, the protection layer 109 may be patterned to expose the bonding pad opening 106a and partially cover the upper insulating layer 105 around a periphery of the opening 106a. For example, as the result of the patterning process, the protection layer 109 may include the first protection layer 109a which is provided on the bonding pad 103 to cover a portion of the upper insulating layer 105, and the second protection layer 109b on or covering the fuse opening 106b. The first protection layer 109a may be confined within the bonding pad region 100a, and the second protection layer 109b may be confined within the fuse region 1001). The first protection layer 109a may be formed in such a way that its sidewall exposed by the bonding pad opening 106a is coplanar with a sidewall of the insulating layer 105 exposed by the bonding pad opening 106a. In other example embodiments, the first protection layer 109a may be recessed toward an outside of the bonding pad 103 to have a width greater than that of the bonding pad opening 106a, as shown in FIG. 2A. In still other example embodiments, as shown in FIG. 2B, the first protection layer 109a may be patterned to extend onto or cover the sidewall of the upper insulating layer 105 on the bonding pad 103 that defines the opening 106a. In the case where the fuse cutting region 102 is formed, the second protection layer 109b may be formed to fill the fuse cutting region 102. A top surface of the second protection layer 109b may be coplanar with that of the upper insulating layer 105, or may be located at a different level (e.g., non-coplanar) from that of the upper insulating layer 105. In other embodiments, depending on a process or order of cutting the fuse 104, the fuse cutting region 102 may be partially or completely filled with the second protection layer 109b. In still other embodiments, the fuse cutting region 102 may not be filled with the second protection layer 109b and remain as an empty space. In this case, the fuse cutting region 102 may be partially or completely filled with an under-fill material, which may be provided during a subsequent under-fill process.

Figure 4E:
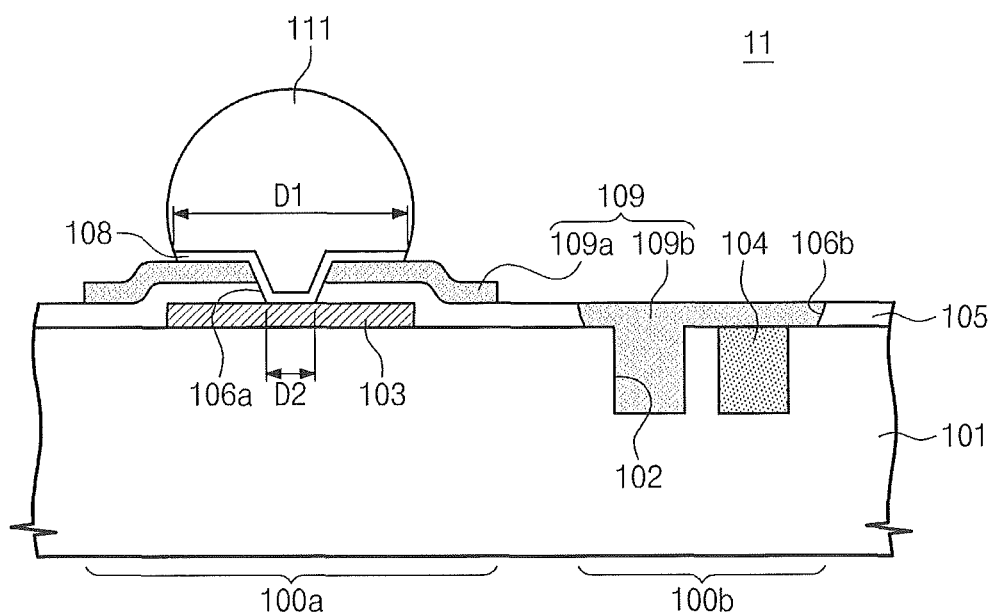

Referring to FIG. 4E, the solder ball 111 may be electrically connected to the bonding pad 103 exposed by the bonding pad opening 106a, and thus, the first electrical connection structure 11 of FIG. 1B may be formed. A dimension D2 of the bonding pad opening 106a may be within a range from about 10% to about 90% of a dimension D1 of the solder ball 111. As shown in FIGS. 2A through 2C, the second to fourth electrical connection structures 12, 13, and 14 may be formed to include the first protection layers 109a having different shapes from each other. The solder ball 111 may include lead (Pb), tin (Sn), silver (Ag), copper (Cu), indium (In), zinc (Zn), bismuth (Bi), antimony (Sb), or any combination thereof. In example embodiments, the solder ball 111 may include lead-free solders (e.g., Sn/Ag, Sn/Cu, or Sn/Cu/Ag). The formation of the solder ball 111 may include forming a solder (for example, using an electroplating process, a deposition process, or an evaporation process), and then, reflowing the solder. The formation of the solder ball 111 may further include removing an oxide layer, which may be unintentionally formed on an exposed surface of the bonding pad 103, and then forming the under-bump metal layer 108. The under-bump metal layer 108 may be a single-layer or multi-layered structure. For example, the under-bump metal layer 108 may include at least one of chromium (Cr), copper (Cu), titanium tungsten (TiW), aluminum (Al), nickel (Ni), gold (Au), nickel vanadium (NiV), or any combination thereof.

Figure 5A:
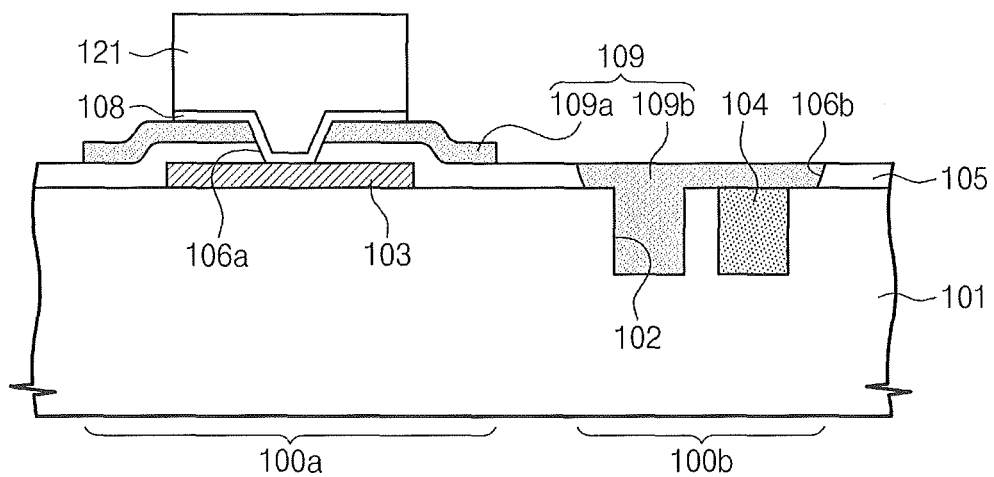
FIGS. 5A and 5B are sectional views illustrating methods of fabricating an electrical connection structure according to further example embodiments of the inventive concept.
Figure 5B:
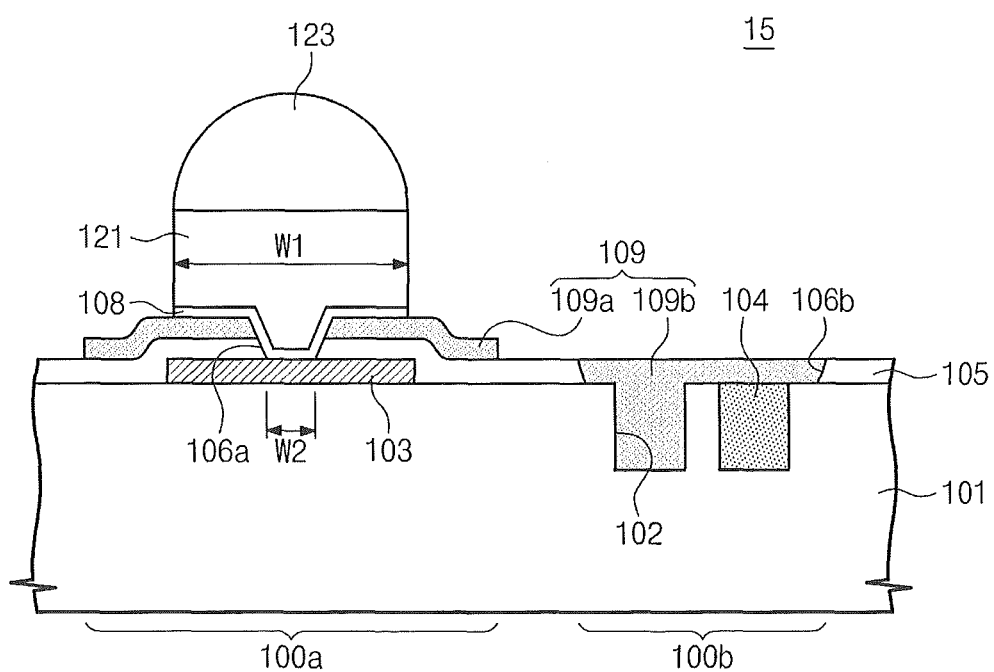

FIGS. 5A and 5B are sectional views illustrating a method of fabricating an electrical connection structure according to other example embodiments of the inventive concept.

Referring to FIG. 5A, a process to form the protection layer 109 may be performed in the same or similar manner as that described with reference to FIGS. 4A through 4D. As a result, the protection layer 109 may include the first protection layer 109a exposing the bonding pad opening 106a and partially covering the upper insulating layer 105 and the second protection layer 109b on or covering the fuse opening 106b. The substrate 101 may include the bonding pad region 100a in which the bonding pad 103 is provided and the fuse region 100b in which the fuse 104 is provided. In the case where there is the fuse cutting region 102 in the substrate 101, the second protection layer 109b may be formed to fill the fuse cutting region 102. The bump pillar 121 may be electrically connected to the bonding pad 103 exposed by the bonding pad opening 106a. The bump pillar 121 may be formed by depositing a conductive material (e.g., of copper or aluminum) or by performing an electroplating process. The formation of the bump pillar 121 may further include removing an oxide layer, which may be unintentionally formed on an exposed surface of the bonding pad 103, and then forming the under-bump metal layer 108.

Referring to FIG. 5B, the solder 123 may be formed to coat the bump pillar 121, and thus, the fifth electrical connection structure 15 of FIG. 2D may be formed. A width W2 of the bonding pad opening 106a may be within a range from about 10% to 90% of a width W1 of the bump pillar 121. As shown in FIGS. 2E through 2G, the sixth to eighth electrical connection structures 16, 17, and 18 may be formed to include the first protection layers 109a having different shapes from each other.

Figure 6A:
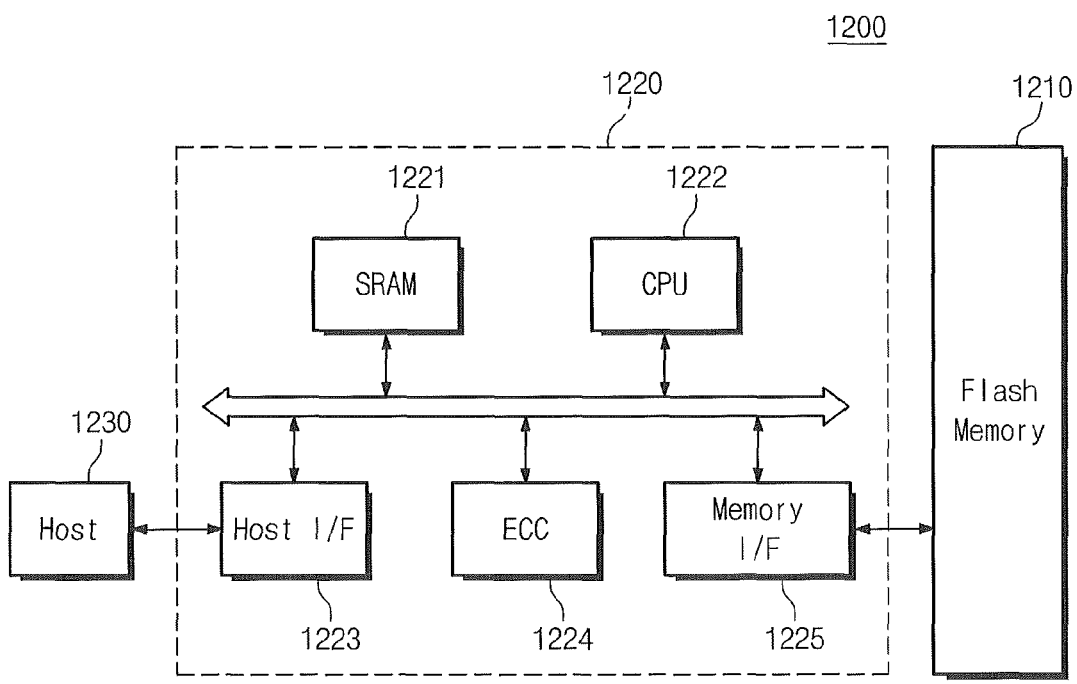
FIG. 6A is a block diagram of a memory card including a semiconductor device according to example embodiments of the inventive concept.
Figure 6B:
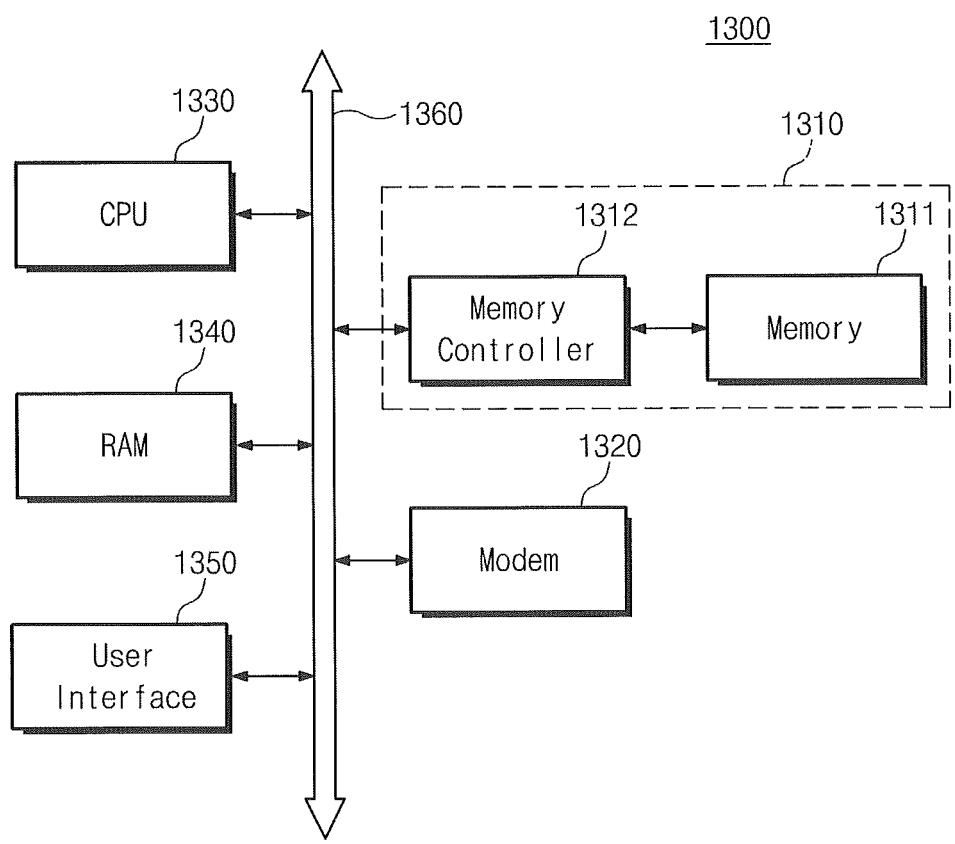
FIG. 6B is a block diagram of an information processing system including a semiconductor device according to example embodiments of the inventive concept.

FIG. 6A is a block diagram of a memory card including a semiconductor device according to example embodiments of the inventive concept. FIG. 6B is a block diagram of an information processing system including a semiconductor device according to example embodiments of the inventive concept.

Referring to FIG. 6A, a memory card 1200 may include a memory controller 1220 controlling general data exchanges between a host 1230 and a memory device 1210. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. A processing unit 1222 may perform general control operations of the memory controller 1220 for data exchange. The memory device 1210 may include at least one semiconductor device including at least one of the electrical connection structures 11-18 according to example embodiments of the inventive concept.

Referring to FIG. 6B, information processing system 1300 may be realized using a memory system 1310 including one or more semiconductor devices including at least one of the electrical connection structures 11-18 according to example embodiments of the inventive concept. For instance, the information processing system 1300 may be a mobile device and/or a computer. In some embodiments, the information processing system 1300 may further include a modem 1320, a central processing unit (CPU) 1330, a random access memory (RAM) 1340, and a user interface 1350, which are electrically connected to a system bus 1360, in addition to and for communication with the memory system 1310. The memory system 1310 may include a memory device 1311 and a memory controller 1312, and in some embodiments, the memory system 1310 may be configured substantially similar or identical to the memory card 1200 described with respect to FIG. 6A. Data processed by the CPU 1330 and/or input from an external source may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, and/or the like may further be included in the information processing system 1300 according to embodiments of the inventive concept.

According to example embodiments of the inventive concept, the stress buffer layer may be formed around the solder ball or the bump pillar to relieve a stress, which may occur in a chip bonding process. Accordingly, it is possible to reduce or suppress the substrate from being bent or cracked by the stress, and thus, mechanical durability and/or electrical characteristics of the semiconductor device can be improved. Furthermore, due to the reduction of the cracking or bending, a wafer or a chip can be handled more easily.

While example embodiments of the inventive concepts have been particularly shown and described, it will be understood by one of ordinary skill in the art that variations in form and detail may be made therein without departing from the spirit and scope of the attached claims.

What is claimed is:

1. An electrical connection structure, comprising:
   a substrate including a first region provided with a bonding pad and a second region provided with a fuse;
   an insulating layer provided on the substrate including a first opening which exposes the bonding pad and a second opening which exposes the fuse;
   a connection terminal disposed in the first region and electrically connected to the bonding pad; and
   a protection layer provided on the insulating layer, the protection layer including a first portion which is disposed within the first region and a second portion which fills the second opening such that a surface of the insulating layer extending between the first and second regions is free of the protection layer and is coplanar with an upper surface of the second portion of the protection layer.

2. The structure of claim 1, wherein the second region further comprises a fuse cutting region including a discontinuous fuse therein.

3. The structure of claim 2, wherein the second portion further fills the fuse cutting region.

4. The structure of claim 3, wherein the insulating layer comprises silicon oxide, silicon nitride, or any combination thereof, and wherein the protection layer comprises polyimide resin.

5. The structure of claim 1, wherein the first portion is partially overlapped with the connection terminal in plan view.

6. The structure of claim 1, wherein the first portion is provided at an outer edge of the connection terminal adjacent a lower sidewall of the connection terminal.

7. The structure of claim 1, wherein the first portion extends into the first opening onto the insulating layer in the first opening.

8. The structure of claim 1, wherein the connection terminal comprises one of a solder ball, a bump pillar, and a bump pillar having a top surface including solder thereon.

9. An electrical connection structure, comprising:
   a substrate including a bonding pad region provided with a bonding pad and a fuse region provided with a fuse laterally spaced apart therefrom;
   an insulating layer provided on the substrate and partially exposing the bonding pad and the fuse;
   a connection terminal provided in the bonding pad region and electrically connected to the bonding pad; and
   a protection layer provided on the insulating layer and partially overlapped with the connection terminal, wherein the protection layer comprises a first portion on the bonding pad region and a second portion on the fuse region, and wherein a surface of the insulating layer extending between the bonding pad region and the fuse region is free of the protection layer and is coplanar with an upper surface of the second portion of the protection layer.

10. The structure of claim 9, wherein the insulating layer includes a bonding pad opening which exposes the bonding pad, wherein the bonding pad opening has an area smaller than an overlap area between the connection terminal and the protection layer.

11. The structure of claim 10, wherein the area of the bonding pad opening ranges from 10 to 90 percent of the overlap area between the connection terminal and the protection layer.

12. The structure of claim 10, wherein the protection layer is provided below the connection terminal and at an outside of the bonding pad opening such that a top surface of the insulating layer includes the protection layer thereon and a side surface of the insulating layer is free of the protection layer.

13. The structure of claim 10, wherein the protection layer is provided below the connection terminal to extend into the bonding pad opening such that top and side surfaces of the insulating layer include the protection layer thereon.

14. The structure of claim 10, wherein the protection layer is provided below the connection terminal to extend into the bonding pad opening, thereby extending onto top and side surfaces of the insulating layer and a portion of the bonding pad exposed by the bonding pad opening.

15. An electrical connection structure, comprising:
   a substrate comprising a cell region including a conductive bonding pad thereon and a peripheral circuit region including a fuse thereon laterally adjacent to the cell region and spaced apart therefrom;
   an insulating layer comprising an inorganic material on the substrate including an opening therein exposing the bonding pad;
   a protection layer comprising an organic material on the insulating layer, the protection layer comprising a first portion confined within the cell region and extending around a periphery of the opening, and a second portion confined within the peripheral circuit region and extending onto the fuse, wherein a surface of the insulating layer extending between the cell region and the peripheral circuit region is free of the protection layer and is coplanar with an upper surface of the second portion of the protection layer; and
   a conductive structure electrically contacting the conductive bonding pad through the opening, wherein at least one surface of the conductive structure is supported by the protection layer.

16. The electrical connection structure of claim 15, wherein the fuse comprises a cut region including a discontinuity therein, and wherein the second protection layer extends into the cut region.

* * * * *